United States Patent
Yoon et al.

[11] Patent Number: 5,773,324
[45] Date of Patent: Jun. 30, 1998

[54] BIDIRECTIONAL HORIZONTAL CHARGE TRANSFER DEVICE AND METHOD

[75] Inventors: Jee Sung Yoon, Kyungki-do; Il Nam Hwang, Seoul, both of Rep. of Korea

[73] Assignee: LG Semicon Co., Ltd., Chungcheongbuk-do, Rep. of Korea

[21] Appl. No.: 689,083

[22] Filed: Jul. 30, 1996

[30]    Foreign Application Priority Data

Apr. 3, 1996 [KR]  Rep. of Korea ............... 10070/1996

[51] Int. Cl.⁶ .................................................. H01L 21/339
[52] U.S. Cl. ............................................ 438/144; 438/146
[58] Field of Search ................................. 257/215, 217, 257/240; 438/144, 146, 147

[56]          References Cited

U.S. PATENT DOCUMENTS 4,087,832  5/1978  Jambotkar ............................... 438/144
5,172,399  12/1992  Hirose ..................................... 257/215
5,173,757  12/1992  Miwanda ................................ 257/215
5,240,873  8/1993  Shinji ...................................... 438/144
5,314,836  5/1994  Lavine .................................... 438/144
5,578,511  11/1996  Son ......................................... 438/144
5,627,096  5/1997  Keigo ..................................... 438/144
5,637,891  6/1997  Lee ......................................... 257/215

Primary Examiner—John Niebling
Assistant Examiner—Michael S. Lebentritt

[57]          ABSTRACT

A bidirectional horizontal charge transfer device and method includes a charge transfer area formed within a substrate, a plurality of first, second, third and fourth poly gates formed over the charge transfer area, an insulating layer formed between the first, second, third and fourth poly gates, a first clock signal applied to the first and second poly gates, a second clock signal applied to the third and fourth poly gates, and a biasing circuit for selectively applying a bias signal to the first and second clock signals so as to selectively change a charge transfer direction.

9 Claims, 3 Drawing Sheets

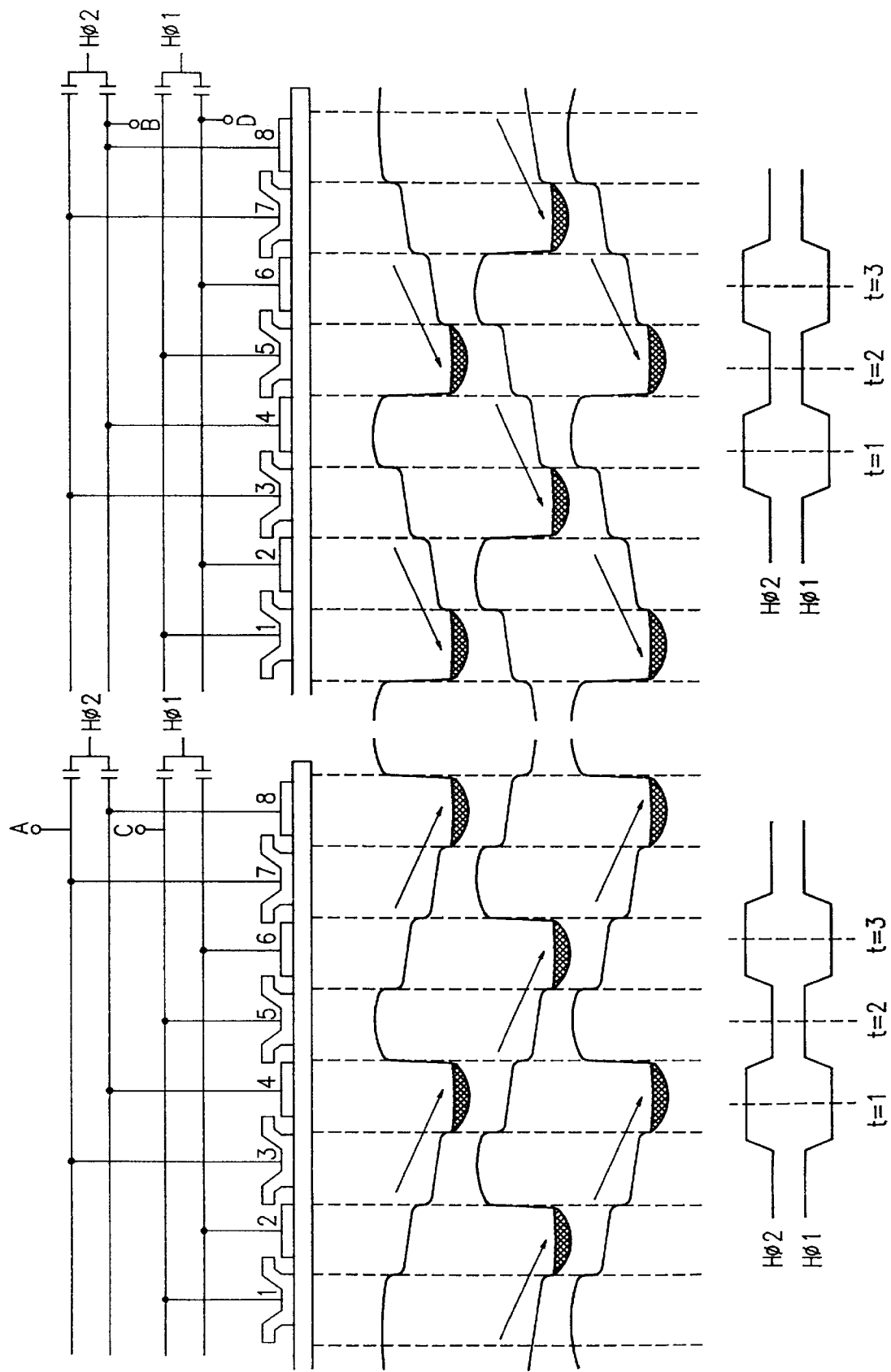

BIDIRECTIONAL HORIZONTAL CHARGE TRANSFER DEVICE AND METHOD

BACKGROUND OF THE INVENTION

1. Field of the Invention

The present invention relates to a charge coupled device, and more particularly to a bidirectional horizontal charge transfer device for a mirror image sensor which allows bidirectional transfer of a signal charge.

2. Description of the Prior Art

Generally, a horizontal charge transfer channel requires a rapid clocking to sense the charge transmitted in parallel from a vertical charge transfer channel within a short time period.

For this reason, the horizontal charge transfer channel typically adopts a 2-phase clocking, which is different from the clocking used in a vertical charge transfer channel.

A conventional horizontal charge coupled device (hereinafter referred to as "HCCD") will be described below with reference to the accompanying drawings.

FIG. 1A is a sectional view showing a structure of a conventional HCCD, FIG. 1B shows a potential profile of the conventional HCCD, and FIG. 1C shows clock signals applied to poly gates of the conventional HCCD.

The conventional HCCD includes a P-type well formed in an N-type semiconductor substrate, and a BCCD 1 formed on a predetermined portion of the P-type well to function as a horizontal charge transfer channel. A gate insulating layer 3 is formed on the BCCD 1 over the surface of the N-type semiconductor substrate. First and second poly gates 4a and 4b are alternatively formed over the gate insulating layer 3 while being insulated from each other. In addition, barrier regions 2 which are supplied with a clock signal H01 or H02 underlie one of the first and second poly gates 4a and 4b.

The conventional HCCD constructed as above, as shown in FIG. 1B, forms a step-type potential well to transmit the charge in one direction even though a same clock signal is applied through the barrier regions 2.

Referring to FIGS. 1B and 1C, since the bottom of the potential well is in the low energy level state, electrons are gathered thereto. That is, electrons are gathered to the potential well under the fourth poly gate 4', which is supplied with the high level clock signal H02 when t=1.

When t=2, a high voltage is applied to the first and second poly gates 1' and 2' so as to lower the energy level of the lower portions of the first and second poly gates 1' and 2', and a low voltage is applied to the third and fourth poly gates 3' and 4' so as to raise the energy level of the third and fourth poly gates 3' and 4'.

However, the electrons gathered around the lower potential well of the fourth poly gate 4' cannot migrate left due to the barrier region 2 under the third poly gate 3'.

If the energy level of the fifth and sixth poly gates 5' and 6' were to be lowered gradually to remove the barrier region on the right of the fourth poly gate 4', the electrons would migrate to the lower portions of the fifth and sixth poly gates 5' and 6' having the low energy level.

Then, when the bias of the fifth and sixth poly gates 5' and 6' is sufficiently raised, the step-type potential well is formed again to move the gathered electrons from the lower portion of the fourth poly gate 4' to the lower portion of sixth poly gate 6'.

In case that t=3, the first, second, fifth and sixth poly gates 1', 2', 5' and 6' are supplied with the low voltage while the third, fourth, seventh and eighth poly gates 3', 4', 7' and 8' are supplied with the high voltage so as to have the same result as when t=0.

A period of the clock signal is from t=1 to t=3. During a one clock signal period, the electrons migrate from the lower portion of the fourth poly gate 4' to the lower portion of the eighth poly gate 8'.

The conventional HCCD using the 2-phase clocking of signals H01 and H02, however, is disadvantageous, for example, in that the barrier layer is formed below one of the first and second poly gates such that a charge can migrate only in one direction.

Therefore, the conventional HCCD cannot be utilized in a mirror image sensor which requires a bidirectional charge transfer.

SUMMARY OF THE INVENTION

The present invention is devised to solve the above-described problems of the conventional horizontal charge transfer device.

Accordingly, it is an object of the present invention to provide a bidirectional horizontal charge transfer device capable of transmitting charges in two directions by dualizing a voltage supplied to poly gates. This forms a potential step without using an ion implantation process to form a barrier layer, as in the conventional HCCDs.

To achieve the above object of the present invention, there is provided a bidirectional horizontal charge transfer device which includes a charge transfer area formed within a surface of a semiconductor substrate, a plurality of first, second, third and fourth poly gates repeatedly formed over the charge transfer area, and an insulating layer provided for insulating the poly gates on the charge transfer area. Here, a first clock signal is applied to the first and second poly gates, and a second clock signal is applied to the third and fourth poly gates. Thus, different potential levels are formed in portions of the charge transfer area corresponding to the lower portions of the first and second poly gates, and different potential levels are formed in portions of the charge transfer area corresponding to the lower portions of the third and fourth poly gates.

Other objects and further scope of applicability of the present invention will becomes apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a bidirectional horizontal charge transfer device, including a charge transfer area formed within a substrate, first, second, third and fourth poly gates formed over the charge transfer area, an insulating layer formed between the first, second, third and fourth poly gates, a first clock signal applied to the first and second poly gates, a second clock signal applied to the third and fourth poly gates, and biasing means for selectively applying a bias signal to the first and second clock signals so as to selectively change a charge transfer direction.

Furthermore, the present invention is directed to a bidirectional horizontal charge transfer method including the steps of forming a charge transfer area within a substrate, forming first, second, third and fourth poly gates over the charge transfer area, applying a first clock signal to the first and second poly gates, applying a second clock signal to the third and fourth poly gates, and selectively biasing the first and second clock signals so as to selectively change a charge transfer direction.

BRIEF DESCRIPTION OF THE DRAWINGS

The above objects and other advantages of the present invention will become more apparent by describing in detail preferred embodiments thereof with reference to the attached drawings in which:

FIGS. 3A and 3B show potential profiles of the HCCD according to the embodiments of the present invention.

DETAILED DESCRIPTION OF THE PREFERRED EMBODIMENTS

A bidirectional horizontal charge transfer device according to the embodiment of the present invention will be described in detail below with reference to the accompanying drawings.

Figure 1A:
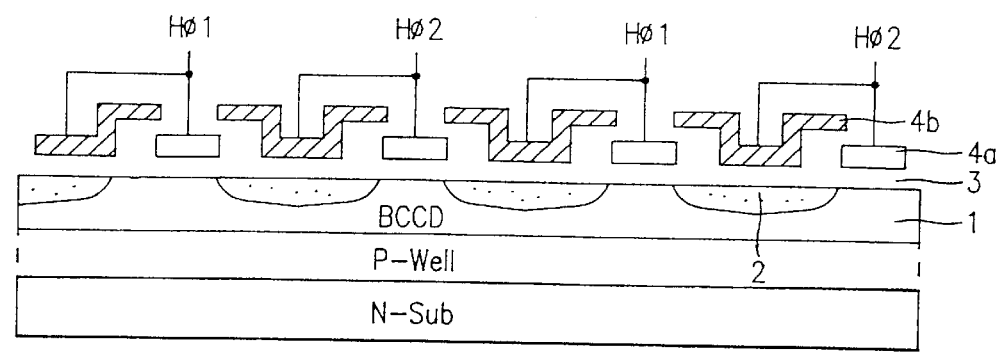
FIG. 1A is a sectional view showing a structure of a conventional HCCD.
Figure 1B:
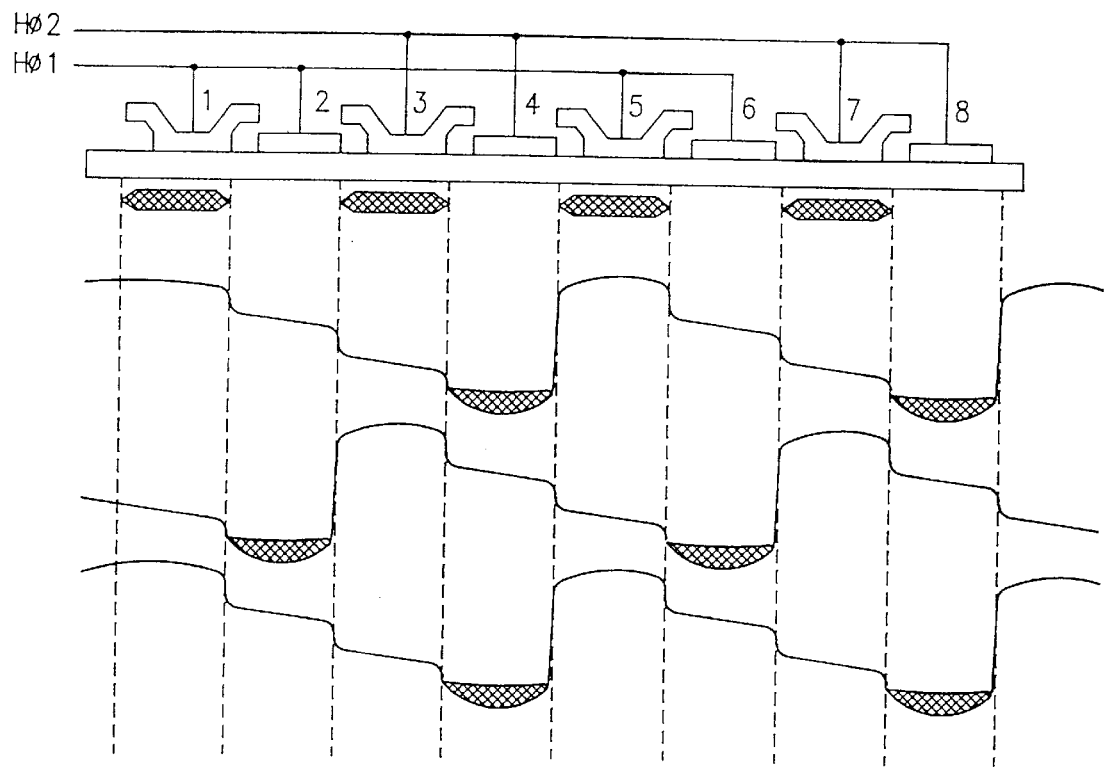
FIG. 1B shows a potential profile of the conventional HCCD.
Figure 1C:
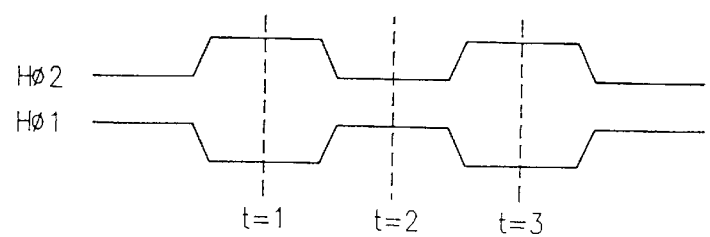
FIG. 1C shows clocks signals used in the conventional HCCD.
Figure 2:
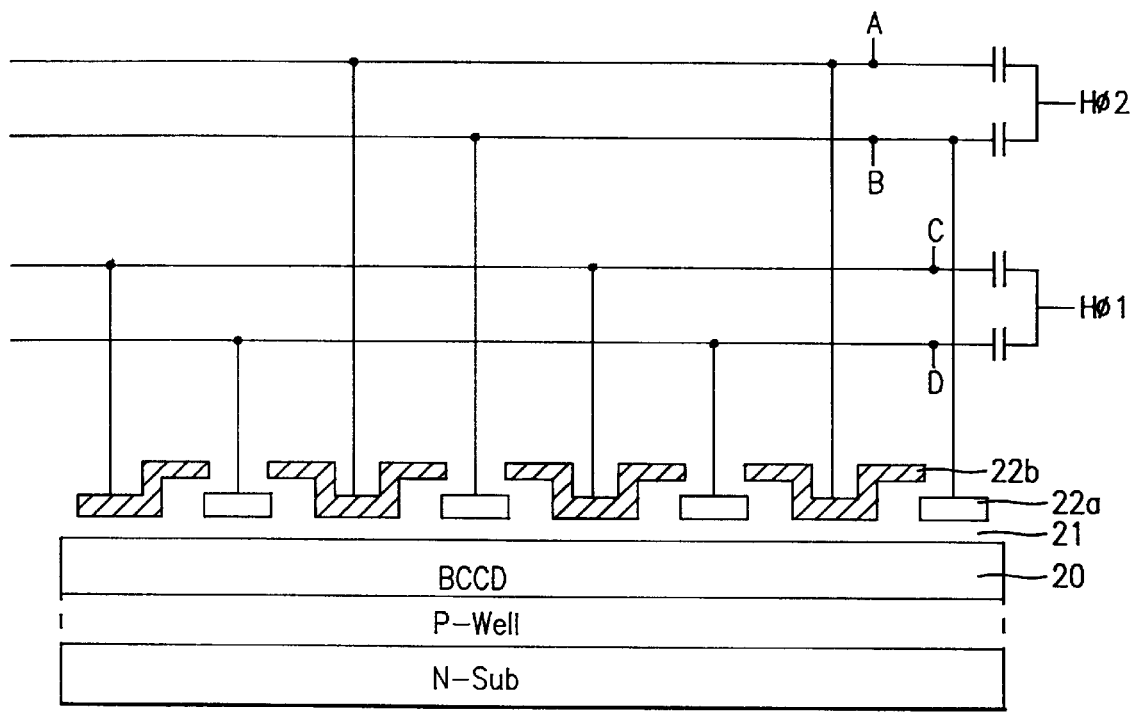
FIG. 2 is a sectional view showing a structure of a HCCD according to the embodiments of the present invention.

FIG. 2 is a sectional view showing a structure of a HCCD according to the embodiments of the present invention, and FIGS. 3A and 3B show potential profiles of the HCCD according to the embodiments of the present invention.

For attaining a bidirectional horizontal charge transfer, the charge transfer device according to the present invention supplies a bias to poly gates for producing a potential barrier layer, without implanting ions such as boron into the lower sides of poly gates formed in a charge transfer area.

At this time, the bias for producing the potential barrier may be externally supplied or produced by an internal voltage distribution.

The bidirectional horizontal charge transfer device according to the present invention is constructed as follows.

First, a P-type well 23 is formed on an N-type semiconductor substrate 24, and a BCCD 20 is formed on a specific area of the P-type well 23 to be utilized as a channel for transferring a signal charge to both directions. Also, a plurality of poly gates 22*a* and 22*b* are alternatively formed on a gate insulating layer 21 formed on the BCCD 20 for gate insulation.

At this time, unlike the conventional HCCD, an ion implantation is not used to form a barrier layer in the BCCD 20 to provide step coverage by differing the potential level. But, the charge is bidirectionally transferred using the following clocking operation.

FIG. 3A shows a potential profile of the HCCD with the electrons moving to the right, whereas FIG. 3B shows a potential profile of the HCCD with the electrons moving to the left.

As shown in FIG. 3A, a plurality of first and second poly gates 1" and 2" are supplied with different levels of the same clock signal H01, and a plurality of third and fourth poly gates 3" and 4" are supplied with different levels of the same clock signal H02. Thus, the potential levels of the lower sides (portions) of the first and second poly gates 1" and 2" and of the third and fourth poly gates 3" and 4" differ from each other, thereby transferring the charge. Here, the clock signals H01 and H02 have opposite phases.

Now, signal lines for supplying the clock signals to the first, second, third and fourth poly gates will be described in detail.

The clock signal H01 is applied to the respective first poly gates 1" through a first signal line 30, and to the respective second poly gates 2" through a second signal line 31. The first and second signal lines 30 and 31 includes capacitors having the same storage capacitance.

The clock signal H02 is applied to the respective third poly gates 3" through a third signal line 32, and to the respective fourth poly gates 4" through a fourth signal line 33. The third and fourth signal lines 32 and 33 includes capacitors having the same storage capacitance.

Here, the capacitors of the signal lines have a storage capacitance which is insufficient to be charged within one unit (period) of the clock signal H01 or H02.

The first, second, third and fourth signal lines 30, 31, 32 and 33 have voltage input terminals C, D, A and B, respectively, for effectively changing the level of the clock signals H01 and H02 being applied to the poly gates. The voltage input terminals A and C are supplied with a same voltage level, and the voltage input terminals B and D are supplied with a same voltage level.

Thus, the transfer direction of the charge becomes opposite depending on whether the voltage is applied to the input terminals A and C or to the input terminals B and D.

An operation of the bidirectional horizontal charge transfer device according to the present invention will be described as below.

Once a voltage for changing the level of clock signals H01 and H02 is applied to the input terminals A and C, the charge migrates to the right as shown in FIG. 3A.

In other words, when t=1, the lower portion of the fourth poly gate 4" becomes the bottom of the potential well.

When t=2, a high level clock signal H01 is applied to the first and second poly gates 1" and 2" to lower third energy levels, whereas a low level clock signal H02 is applied to the third and fourth poly gates 3" and 4" to raise their energy levels. However, when a voltage is applied to the voltage input terminal A, the level of the clock signal H02 being applied to the poly gate 3", for example, changes. As a result, a barrier layer is produced in the lower portion of the third poly gate 3" and the electrons gathered around the lower portion of the fourth poly gate 4" migrate to the right.

That is, the level of the clock signals H01 and H02 being applied to the first and third poly 1" and 3" is changed by the voltage applied to the input terminals A and C. This forms the potential barrier layer in the lower portions of the first and third poly gates 1" and 3". Due to this potential barrier layer, the charge migrates in the right direction only.

Similarly, when the voltage for effectively changing the level of clock signals H01 and H02 being supplied to the poly gates, is applied to the input terminals B and D, the charge migrates to the left as shown in FIG. 3B.

In other words, when t=1, the lower portion of the fifth poly gate 5" (which receives the same voltage level as the first poly gate 1") becomes the bottom of the potential well.

When t=2, the high voltage clock signal H01 is applied to the fifth poly gate 5" and sixth poly gate 6" (the six poly gate receiving the same voltage level as the second poly gate 2") to lower the energy level, while the seventh and eighth poly gates 7" and 8" are applied with the low voltage clock signal H02 to raise their energy level. Here, the seventh and eighth poly gates receive the same voltage level as the third and fourth poly gates 3" and 4", respectively.

However, the electrons gathered around the lower side of the fifth poly gate 5" cannot migrate in the right direction since the potential barrier exists on the right of the fifth poly gate 5".

If the energy level of the third and fourth poly gates 3" and 4" is lowered to eliminate the potential barrier on the left of the fifth poly gate 5", the electrons around the lower side of the fifth poly gate 5" migrate to the lower side of the third and fourth poly gates 3" and 4" which have the low energy level.

When the energy level of the third and fourth poly gates 3" and 4" is sufficiently lowered, the step-type potential well is formed again to move the bottom of the potential well from the lower side of the fifth poly gate 5" to the lower side of the third poly gate 3".

In case t=3, the low level clock signal H01 is applied to the first, second, fifth and sixth poly gates 1", 2", 5" and 6", and the high level clock signal H02 is applied to the third, fourth, seventh and eighth poly gates 3", 4", 7" and 8". Thus, the resulting state becomes identical to the case when t=0.

When t=1 to 3, the clock pulse of clock signals H01 and H02 has one period. During this period and when the voltage is applied to the input terminals B and D, the electrons migrate from the fifth poly gate 5" to the first poly gate 1". That is, they migrate from the right to the left, as shown in FIG. 3B.

The bidirectional horizontal charge transfer device according to the present invention as described above produces a barrier layer in the charge transfer area by using an external or internal bias and without using an ion implantation process. As a result, the potential step is efficiently controlled while simplifying the process thereof.

Furthermore, the charge transfer direction can be easily changed by controlling the clock signals and the voltage applied to the voltage input terminals A and C or B and D. This is a desirable feature for a mirror image sensor and the like, which requires a bidirectional charge transfer device.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A bidirectional horizontal charge transfer method comprising the steps of:

forming a charge transfer area within a substrate;

forming first, second, third and fourth poly gates over the charge transfer area;

applying a first clock signal to the first and second poly gates;

applying a second clock signal to the third and fourth poly gates; and selectively biasing the first and second clock signals so as to selectively change a charge transfer direction.

2. A bidirectional horizontal charge transfer method as claimed in claim 1, further comprising the step of:

insulating the first, second, third and fourth poly gates.

3. A bidirectional horizontal charge transfer method as claimed in claim 1, wherein the step of applying the first clock signal includes the step of:

applying the first clock signal to the first and second poly gates through first and second signal lines.

4. A bidirectional horizontal charge transfer method as claimed in claim 3, wherein the step of applying the second clock signal includes the step of:

applying the second clock signal to the third and fourth poly gates through third and fourth signal lines.

5. A bidirectional horizontal charge transfer method as claimed in claim 4, wherein the biasing step includes the step of:

supplying a voltage signal to a plurality of voltage input terminals connected to the second and fourth signal lines for changing a level of the first and second clock signals.

6. A bidirectional horizontal charge transfer method as claimed in claim 4, wherein the biasing step includes the step of:

supplying a voltage signal to a plurality of voltage input terminals connected to the first and third signal lines for changing a level of the first and second clock signals.

7. A bidirectional horizontal charge transfer method as claimed in claim 3, wherein the first signal line includes a first capacitor, and the second signal line includes a second capacitor, the first and second capacitors having a substantially same capacitance.

8. A bidirectional horizontal charge transfer method as claimed in claim 4, wherein the third signal line includes a third capacitor, and the fourth signal line includes a fourth capacitor, the third and fourth capacitors having a substantially same capacitance.

9. A bidirectional horizontal charge transfer method as claimed in claim 1, wherein the first and second clock signals have a phase opposite to each other.

* * * * *